US012626777B2

(12) United States Patent
Aoki et al.

(10) Patent No.: US 12,626,777 B2
(45) Date of Patent: May 12, 2026

(54) SEMICONDUCTOR MEMORY DEVICE

(71) Applicant: Kioxia Corporation, Tokyo (JP)

(72) Inventors: Takeshi Aoki, Ebina Kanagawa (JP); Masaharu Wada, Yokohama Kanagawa (JP); Mamoru Ishizaka, Hiratsuka Kanagawa (JP)

(73) Assignee: Kioxia Corporation, Tokyo (JP)

( * ) Notice: Subject to any disclaimer, the term of this patent is extended or adjusted under 35 U.S.C. 154(b) by 132 days.

(21) Appl. No.: 18/768,033

(22) Filed: Jul. 10, 2024

(65) Prior Publication Data

US 2025/0022530 A1      Jan. 16, 2025

(30) Foreign Application Priority Data

Jul. 10, 2023      (JP) ................................. 2023-113315

(51) Int. Cl.
*G11C 29/44*          (2006.01)
(52) U.S. Cl.
CPC .................................... *G11C 29/44* (2013.01)
(58) Field of Classification Search
CPC ........... G11C 7/06; G11C 29/14; G11C 29/04; G11C 7/106
See application file for complete search history.

(56) References Cited

U.S. PATENT DOCUMENTS

| | | | |
|---|---|---|---|
| 2004/0026716 A1 | 2/2004 | Ishimatsu et al. | |
| 2008/0084771 A1* | 4/2008 | Kajigaya .............. | G11C 29/848 |
| | | | 365/205 |
| 2013/0070506 A1 | 3/2013 | Kajigaya | |
| 2020/0258993 A1 | 8/2020 | Haraguchi | |

FOREIGN PATENT DOCUMENTS

| | | |
|---|---|---|
| JP | 2008-097675 A | 4/2008 |
| JP | 2013-065638 A | 4/2013 |
| TW | I735905 B | 8/2021 |
| WO | 2002/061839 A1 | 8/2002 |

OTHER PUBLICATIONS

M. Kaku et al., "An 833MHz Pseudo-Two-Port Embedded DRAM for Graphics Applications," 2008 IEEE International Solid-State Circuits Conference—Digest of Technical Papers, San Francisco, CA, USA, 2008, pp. 276-613, doi: 10.1109/ISSCC.2008.4523164.

* cited by examiner

*Primary Examiner* — Han Yang
(74) *Attorney, Agent, or Firm* — Kim & Stewart LLP

(57)          ABSTRACT

A memory device includes memory cells, first wirings extending along a first direction and connected to the cells, second wirings extending along a second direction and connected to the cells, the second direction intersecting the first direction, third wirings extending along a third direction and each connected to one or more second wirings, the third direction intersecting the first and second directions, sense circuits each connected to one or more third wirings, a switching circuit connected to the circuits and selectively outputting signals from the sense circuits, and a control circuit storing first addresses indicating second and third wirings connected to defective cells, and when a memory cell is selected, determining second addresses indicating second and third wirings connected to the selected cell, and based on the first and second addresses, controlling the switching circuit not to output signals from one or more sense circuits connected to the defective cells.

21 Claims, 12 Drawing Sheets

*FIG. 8*

SEMICONDUCTOR MEMORY DEVICE

CROSS-REFERENCE TO RELATED APPLICATION(S)

This application is based upon and claims the benefit of priority from Japanese Patent Application No. 2023-113315, filed Jul. 10, 2023, the entire contents of which are incorporated herein by reference.

FIELD

Embodiments described herein relate generally to a semiconductor memory device.

BACKGROUND

A semiconductor memory device such as a dynamic random access memory (DRAM), in which memory cells are arrayed three-dimensionally, is being developed. In order to reduce a bit line capacity and thereby secure an improved sensing margin, a three-dimensional memory cell array has a hierarchical bit line structure such that bit lines are tiered in global bit lines and local bit lines. In this kind of memory cell array, when a defective cell appears, the defective cell needs to be replaced with or rescued by a redundant cell.

BRIEF DESCRIPTION OF THE DRAWINGS

FIG. 8 is a conceptual drawing showing an example of a configuration and an example of an operation of a switch control circuit.

DETAILED DESCRIPTION

Embodiments provide a semiconductor memory device such that even when a defective cell appears, the defective cell can be reliably replaced with a redundant cell.

In general, according to one embodiment, a semiconductor memory device, comprises a cell array including a plurality of memory cells; a plurality of first wirings extending along a first direction and connected to the memory cells; a plurality of second wirings extending along a second direction and connected to the memory cells, the second direction intersecting the first direction; a plurality of third wirings extending along a third direction and each connected to one or more of the second wirings, the third direction intersecting the first and second directions; a plurality of sense circuits each connected to one or more of the third wirings; a switching circuit connected to the sense circuits and through which signals from the sense circuits are selectively output; and a control circuit configured to: store first addresses indicating second and third wirings that are connected to defective memory cells, and when a first memory cell is selected for a read operation, determine second addresses indicating second and third wirings that are connected to the first memory cell, and based on the first and second addresses, control the switching circuit so as not to output signals from one or more first sense circuits that are connected to the defective memory cells via the second and third wirings.

First Embodiment

Figure 1:
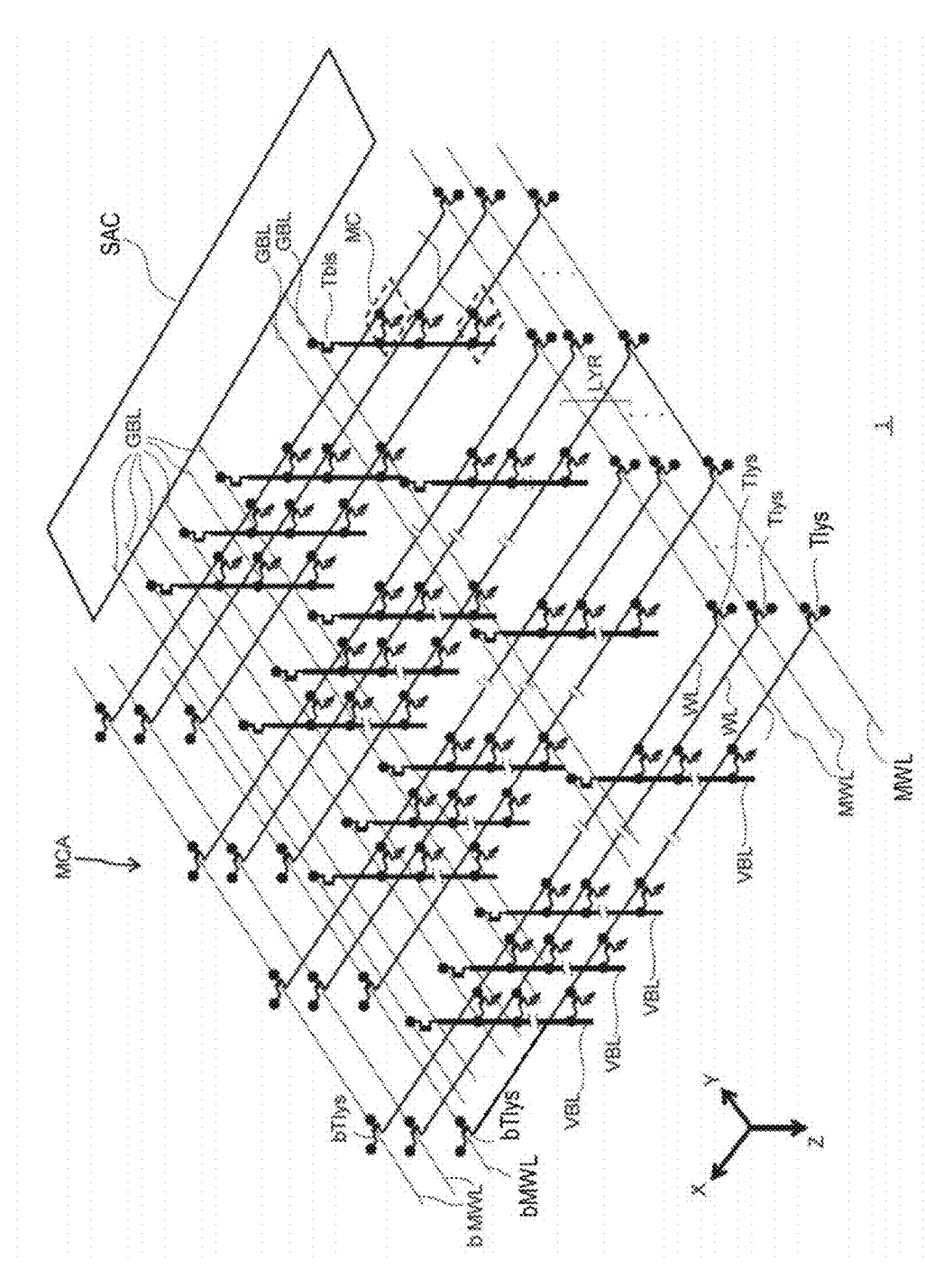
FIG. 1 is a schematic perspective view showing a configuration of a semiconductor memory device according to a first embodiment.

FIG. 1 is a schematic perspective view showing a configuration of a semiconductor memory device 1 according to a first embodiment. The semiconductor memory device 1 of the present embodiment is, for example, a DRAM including a three-dimensional memory cell array MCA in which memory cells MC are arrayed three-dimensionally. The memory cell MC is used as a memory cell in which one-bit data or multibit data are stored.

Multiple memory cells MC are arrayed two-dimensionally in a matrix form in an X-Y plane, configuring one memory cell layer LYR. Also, a memory cell array MCA includes multiple memory cell layers LYR being stacked in a Z direction. The multiple memory cell layers LYR are stacked approximately parallel to each other in the memory cell array MCA. Because of this, the multiple memory cells MC are arrayed three-dimensionally.

The semiconductor memory device 1 according to the present embodiment includes the memory cell array MCA, multiple word lines WL, multiple bit lines VBL, multiple global bit lines GBL, multiple bit line select transistors Tbls, and multiple memory cell layer select transistors Tlys and bTlys.

The word lines WL extend in the X direction in the plane of the memory cell layer LYR, and are connected to the memory cells MC arrayed in the X direction. The word lines WL are arrayed in the Y direction in the memory cell layer LYR. One end of the word lines WL is connected to an unshown word line driver via the memory cell layer select transistor Tlys. The other end of the word lines WL is connected to an unselected voltage source of the word line WL via the memory cell layer select transistor bTlys. The word lines WL are configured in the same way in each memory cell layer LYR.

A layer select word line MWL is connected to a gate of the memory cell layer select transistor Tlys, and switches the memory cell layer select transistor Tlys to a conductive state when the memory cell layer LYR is selected. A layer select word line bMWL is connected to a gate of the memory cell layer select transistor bTlys, and switches the memory cell layer select transistor bTlys to a non-conductive state when the memory cell layer LYR is selected. Conversely, the layer select word line MWL switches the memory cell layer select transistor Tlys to a non-conductive state when the memory cell layer LYR is not selected. The layer select word line bMWL switches the memory cell layer select transistor bTlys to a conductive state when the memory cell layer LYR is not selected. The layer select word line bMWL transmits a reverse-phase (or reverse logic) signal to the layer select word line MWL. This means that when one of the memory cell layer select transistors Tlys and bTlys is in the conductive state, the other is in the non-conductive state.

The bit lines (i.e., the local bit lines) VBL extend in the direction in which the memory cell layers LYR are stacked in the Z direction, and are connected to the memory cells MC arrayed in the Z direction. The memory cells MC arrayed in the Z direction are connected to the same bit line VBL. The bit lines VBL are arrayed two-dimensionally in a matrix form in the X-Y plane, corresponding to the memory cells MC in the memory cell layer LYR, in the plan view seen from the Z direction. One end of the bit lines VBL is connected to the global bit line GBL via the bit line select transistor Tbls.

The global bit lines GBL extend in the Y direction in the X-Y plane, and are connected via the bit line select transistor Tbls to one end of the bit lines VBL arrayed in the Y direction. The bit lines VBL arrayed in the Y direction are connected to the same global bit line GBL. The global bit lines GBL are arrayed in the X direction. One end of the global bit lines GBL is connected to a sense circuit SAC. The global bit line GBL is provided to be shared by the memory cell layers LYR in the memory cell array MCA.

Figure 3:
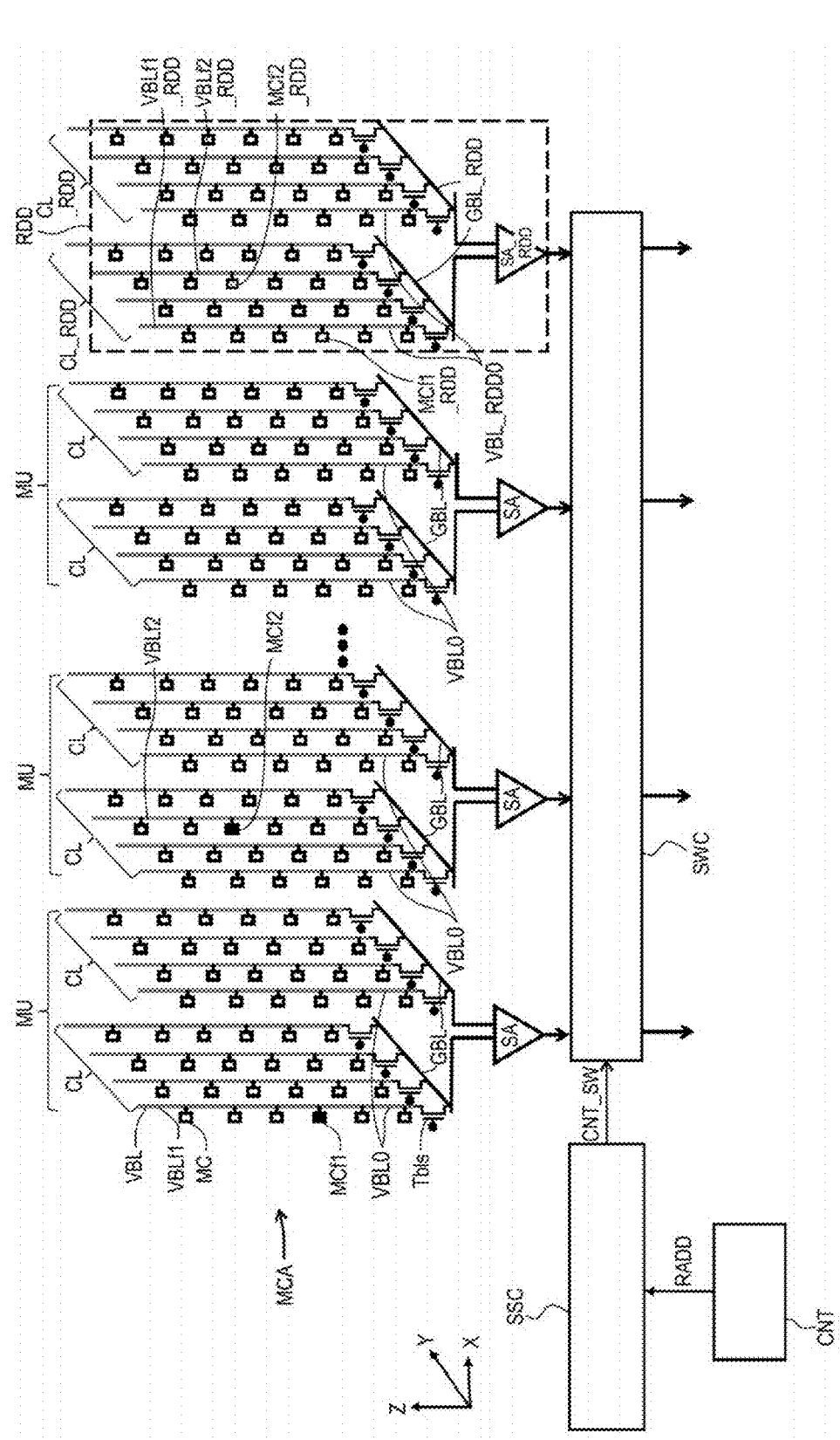
FIG. 3 is a block diagram showing a configuration of the semiconductor memory device according to the first embodiment.

The sense circuit SAC is connected to the global bit lines GBL. As shown in FIG. 3, the sense circuit SAC includes multiple sense amplifiers SA connected to two global bit lines GBL. The sense circuit SAC receives a read-out voltage that is in accordance with data stored in the selected memory cell MC via one of the selected pair of global bit lines GBL, and receives a reference voltage that is in accordance with a reference signal from the other global bit line GBL. Furthermore, the sense circuit SAC detects data logic by comparing the read-out voltage and the reference voltage, and amplifying a difference between the voltages.

Figure 2:
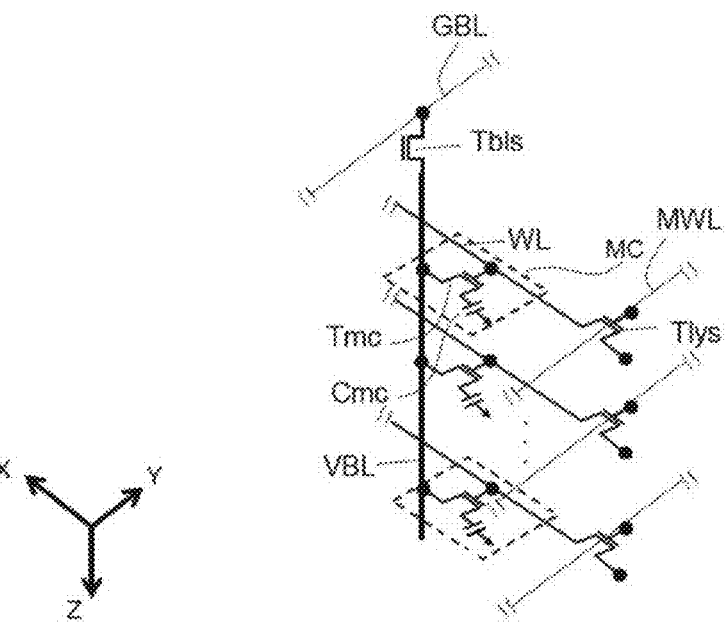
FIG. 2 is a perspective view showing one bit line and a configuration of a periphery thereof.

FIG. 2 is a perspective view showing one bit line VBL and a configuration of a periphery thereof. Each memory cell MC includes a cell transistor Tmc and a cell capacitor Cmc. A gate of the cell transistor Tmc is connected to one word line WL. Either a source or a drain of the cell transistor Tmc is connected to the bit line VBL, and the other of the source and the drain is connected to one end of the cell capacitor Cmc. The cell capacitor Cmc is connected between the other of the source and the drain of the cell transistor Tmc and a reference voltage source (for example, a ground or an intermediate voltage VDD/2).

The memory cell MC can store logical data by accumulating a charge in the cell capacitor Cmc via the cell transistor Tmc, or by releasing a charge from the cell capacitor Cmc.

FIG. 3 is a block diagram showing a configuration of the semiconductor memory device 1 according to the first embodiment. The semiconductor memory device 1 includes the memory cell array MCA, the sense amplifier SA, a switching circuit SWC, a switch control circuit SSC, and a controller CNT. In FIG. 3, the word lines WL are not shown for illustration purposes.

The memory cells MC arrayed in the Z direction are all connected to one bit line (i.e., local bit line) VBL extending in the Z direction. The bit lines VBL arrayed in the Y direction are provided corresponding to one global bit line GBL extending in the Y direction, and are all connected to the global bit line GBL corresponding thereto. The global bit lines GBL are connected to the sense amplifier SA in pairs. In this way, the semiconductor memory device 1 has a hierarchical bit line configuration formed of the bit line VBL and the global bit line GBL. In the present embodiment, the memory cell array MCA is a three-dimensional memory cell array. However, provided that the memory cell array MCA has a hierarchical bit line configuration, the memory cell array MCA may be a planar memory cell array in which multiple memory cells MC are disposed two-dimensionally in a planar form.

As shown in FIG. 3, a pair of the global bit lines GBL are connected to one sense amplifier SA. The n bit lines VBL corresponding to each pair of global bit lines GBL connected to each sense amplifier SA are connected to multiple memory cells MC in which data are stored. Each sense amplifier SA is such that when reading data from the memory cell MC of the bit line VBL connected to one global bit line GBL, the sense amplifier SA transmits an intermediate voltage reference signal of, for example, "1" and "O" to the other global bit line GBL. Although n is 4 in FIG. 3, n may be 3 or less, or 5 or greater.

The bit line select transistor Tbls is provided between each bit line VBL and the global bit line GBL. The bit line select transistor Tbls selectively connects one bit line VBL at one time to one global bit line GBL in each memory unit MU. That is, the bit line select transistor Tbls selectively connects the bit line VBL to one global bit line GBL in each memory unit MU when a data read operation or a data write operation is carried out. The bit line select transistor Tbls does not connect any bit line VBL to the other global bit line GBL.

Furthermore, of the memory cells MC connected to one bit line VBL connected to one of the pair of global bit lines GBL, the one memory cell MC connected to the word line WL selected in accordance with a row address RADD outputs data as the selected memory cell MC. Alternatively, data are written into the selected memory cell MC. No bit line VBL is connected to the other of the pair of global bit lines GBL, and a reference signal is transmitted from the sense amplifier SA.

Each of the sense amplifiers SA is connected to a pair of the global bit lines GBL. Each sense amplifier SA compares data obtained from one global bit line GBL and a reference signal obtained from the other global bit line GBL, and detects logical data based on the reference signal. The reference signal is data relating to an intermediate voltage of, for example, "1" and "0".

Conversely, when the memory cell MC connected to the one bit line VBL connected to the other of the pair of global bit lines GBL is selected, no bit line VBL is connected to the one of the pair of global bit lines GBL, and a reference signal is transmitted from the sense amplifier SA.

The bit lines VBL and the memory cells MC corresponding to each global bit line GBL are also called a column CL. Also, two data columns CL corresponding to one sense amplifier SA configure one memory unit MU.

One redundant unit RDD is provided for one or more of the memory units MU. The redundant unit RDD has the same configuration as the memory unit MU. Consequently, one of the memory units MU may be set as the redundant unit RDD. In order to distinguish the redundant unit RDD from the memory unit MU, "RDD" is affixed to reference signs for the redundant unit RDD. For example, a sense amplifier SA_RDD is connected to a pair of global bit lines GBL_RDD of the redundant unit RDD.

When there is a defective cell in a bit line VBL of a memory unit MU, a bit line VBL_RDD is used to store data instead of the bit line VBL that has the defective cell. At this time, a whole of the one bit line VBL that has the defective cell is replaced with one bit line VBL_RDD of the redundant unit RDD. This means that when a data read operation is carried out, data are read from the bit line VBL_RDD of the redundant unit RDD instead of from the bit line VBL that has the defective cell.

For example, in FIG. 3, a bit line VBLf1 that has a defective cell MCf1 is replaced with a bit line VBLf1_RDD of the redundant unit RDD that has a memory cell MCf1_RDD. In this case, the whole of the bit line VBL is replaced, because of which other memory cells connected to the bit line VBLf1 are also replaced with memory cells connected to the bit line VBLf1_RDD. The memory cells of the bit line VBLf1 share the word line WL with the memory cells of the bit line VBLf1_RDD of the redundant unit RDD. The defective cell MCf1 is replaced with the memory cell MCf1_RDD of the bit line VBLf1_RDD of the redundant unit RDD connected to the same word line WL. That is the row addresses RADD of the defective cell MCf1 and the memory cell MCf1_RDD of the bit line VBLf1_RDD are the same.

Also, a bit line VBLf2 that has a defective cell MCf2 is replaced with a bit line VBLf2_RDD of the redundant unit RDD that has a memory cell MCf2_RDD. In this case too, the whole of the bit line VBL is replaced, because of which other memory cells connected to the bit line VBLf2 are also replaced with memory cells connected to the bit line VBLf2_RDD. The memory cells of the bit line VBLf2 share the word line WL with the memory cells of the bit line VBLf2_RDD of the redundant unit RDD. The defective cell MCf2 is replaced with the memory cell MCf2_RDD of the bit line VBLf2_RDD of the redundant unit RDD connected to the same word line WL. That is the row addresses RADD of the defective cell MCf2 and the memory cell MCf2_RDD of the bit line VBLf2_RDD are the same.

When carrying out a data read operation, the switching circuit SWC selectively outputs an output signal from the sense amplifier SA_RDD in order to read data from the bit line VBL_RDD of the redundant unit RDD instead of the bit line VBL that has a defective cell, as heretofore described.

When there is no defective cell in the bit line VBL that is a read target of each memory unit MU, the switching circuit SWC selects only an output signal from the sense amplifier SA of the memory unit MU, and does not select an output signal from the sense amplifier SA_RDD of the redundant unit RDD.

In this way, the switching circuit SWC according to the present embodiment switches between output signals from the sense amplifiers SA and SA_RDD of each bit line (i.e., local bit line) VBL. For example, when the addresses of the bit lines VBLf1 and VBLf2 that have the defective cells MCf1 and MCf2 are specified when carrying out a read operation, the switching circuit SWC selectively outputs an output signal from the sense amplifier SA_RDD of the redundant unit RDD instead of the bit lines VBLf1 and VBLf2. Because of this, data relating to the bit line VBLf1_RDD are output instead of data relating to the bit line VBLf1, and data relating to the bit line VBLf2_RDD are output instead of data relating to the bit line VBLf2. When the address of the bit line VBL other than the bit lines VBLf1 and VBLf2 is specified, the switching circuit SWC selects only the sense amplifier SA of the memory unit MU, without selecting the sense amplifier SA_RDD of the redundant unit RDD. A more detailed configuration of the switching circuit SWC will be described hereafter.

The switch control circuit SSC stores the address of a defective cell before a read operation, and controls the switching circuit SWC based on an address specified when a read operation is carried out. That is, the switch control circuit SSC stores the address of the global bit line GBL that has a defective cell and the address of the bit line (i.e., local bit line) VBL before a read operation, and outputs a control signal CNT_SW based on the address of the global bit line GBL that has the selected cell, which is a read target, and the address of the bit line VBL. A more detailed configuration of the switch control circuit SSC will be described hereafter.

The controller CNT transmits the row address RADD of the selected word line WL specified when a read operation is carried out to the switch control circuit SSC. A central processing unit (CPU) and software, or a logic circuit such as a programmable logic controller (PLC), may be used as the controller CNT.

Figure 4:
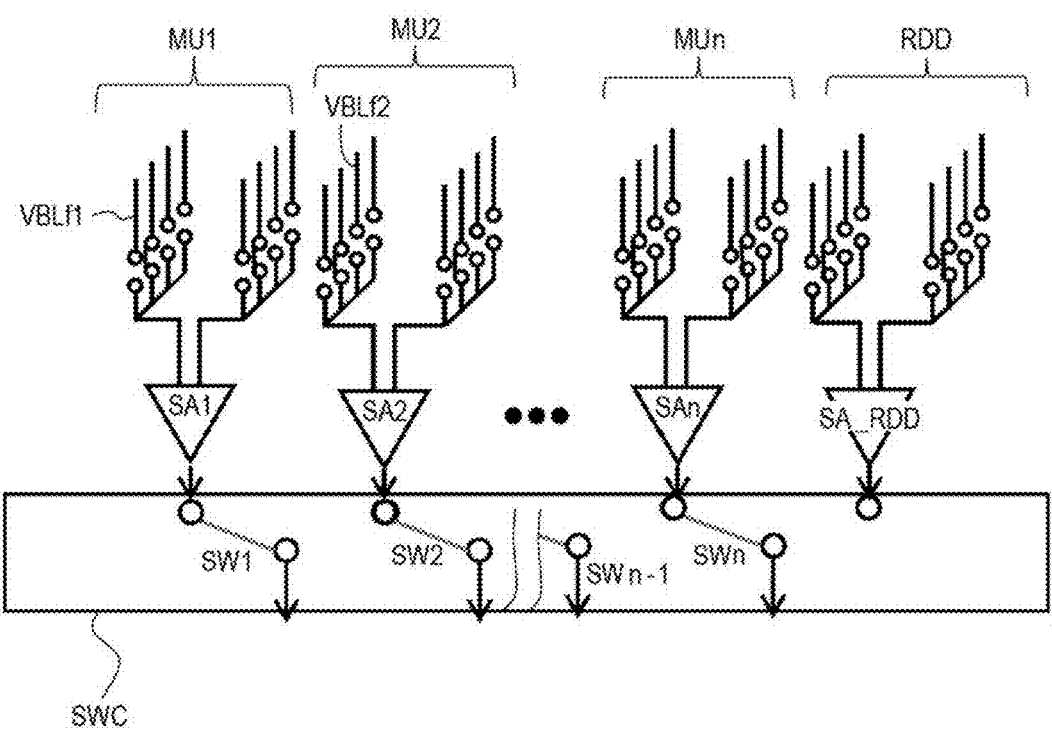
FIG. 4 through FIG. 6 are conceptual drawings showing an example of a configuration and an example of an operation of a switching circuit.
Figure 5:
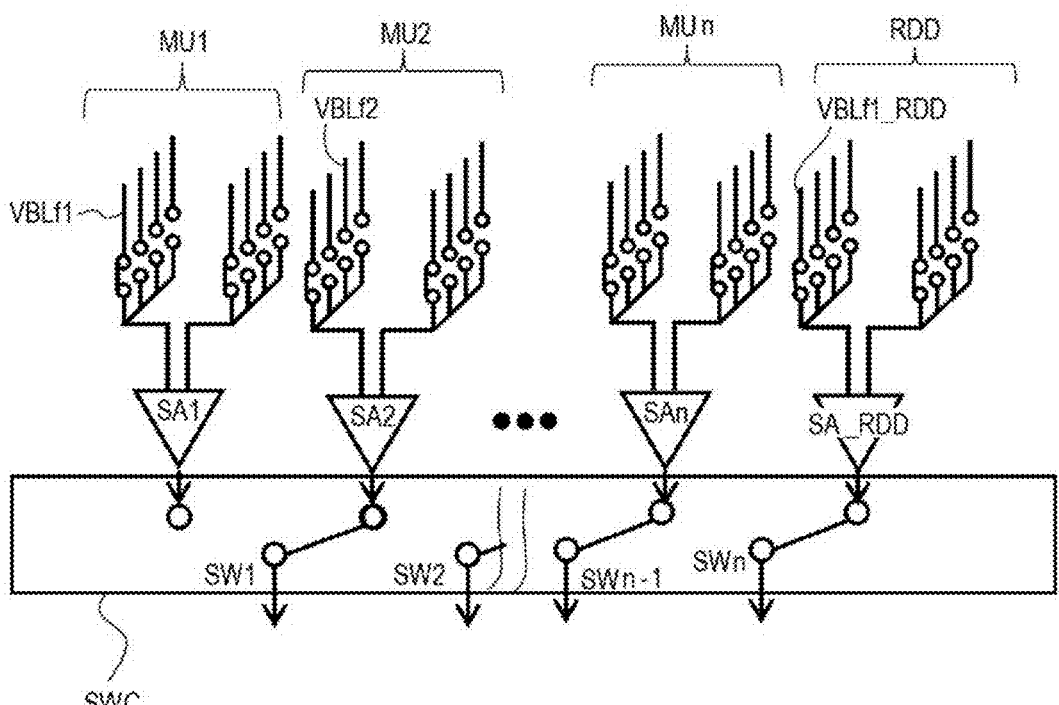
Figure 6:
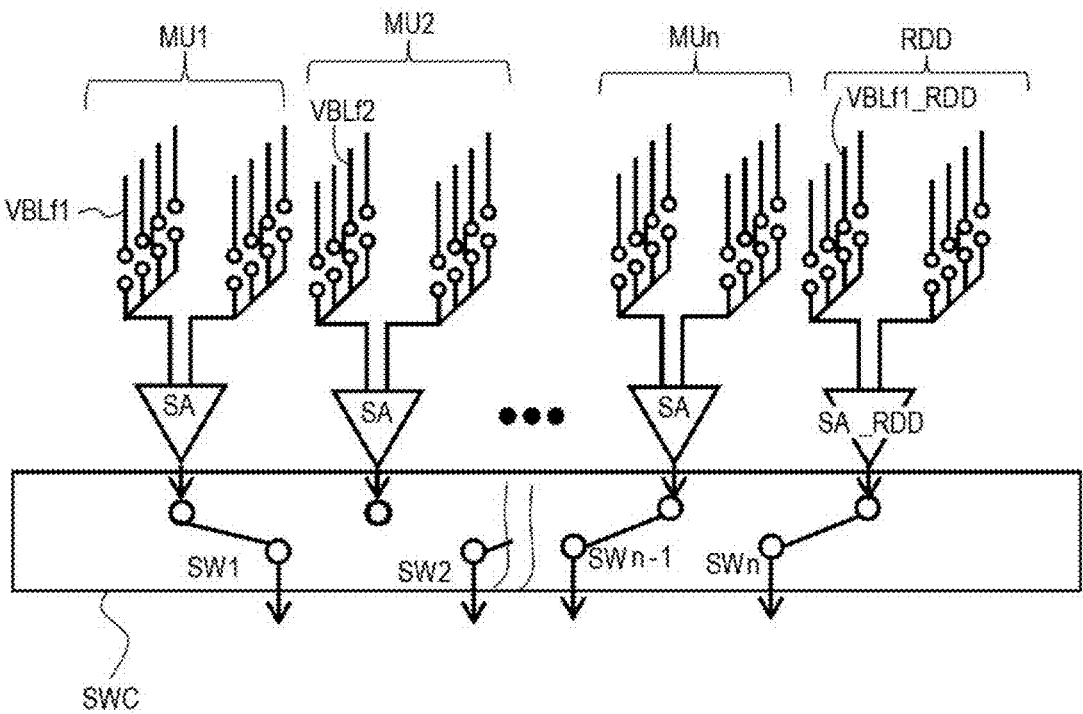

FIGS. 4 to 6 are conceptual drawings showing an example of a configuration and an example of an operation of the switching circuit SWC. There are n (n is an integer of 2 or greater) memory units MU1 to MUn provided corresponding to one redundant unit RDD. In this case, the switching circuit SWC includes switch elements SW1 to SWn corresponding to the memory units MU1 to MUn or the sense amplifiers SA1 to SAn corresponding thereto. The switching circuit SWC is provided corresponding to the memory units MU1 to MUn or the sense amplifiers SA1 to SAn. A switch element SWk (k is any integer between 1 and n−1) can be connected to each of two neighboring memory units MUk and MUk+1. The switch element SWn can be connected to the memory unit MUn and the redundant unit RDD. That is, the switch element SWn can carry out switching between the sense amplifier SA_RDD of the redundant unit RDD and the sense amplifier SAn neighboring the sense amplifier SA_RDD.

FIG. 4 shows a state of the switching circuit SWC when there is no defective cell in the bit line VBL that is a read target in each memory unit MU. In this case, the switch elements SW1 to SWn are connected to the sense amplifiers SA of the memory units MU1 to MUn respectively. That is, the switch elements SW1 to SWn are in an initial state, and no switching of the switch elements SW1 to SWn is being carried out. Consequently, the switching circuit SWC selectively outputs output signals from the sense amplifiers SA of all the memory units MU1 to MUn. The output signal from the sense amplifier SA_RDD of the redundant unit RDD is not selected.

FIG. 5 shows a state of the switching circuit SWC when the bit line VBLf1 that has the defective cell MCf1 is a read target. In this case, the memory unit MU1 that has the bit line VBLf1 is not selected, because of which the switch elements SW1 to SWn switch to connect to the sense amplifiers SA of the memory units MU2 to MUn and the redundant unit RDD respectively. That is, the switching circuit SWC switches all the switch elements SW1 to SWn from the switch element SW1 corresponding to the memory unit MU1 that has the bit line VBLf1 and the sense amplifier SA1 to the switch element SWn corresponding to the sense amplifier SAn neighboring the sense amplifier SA_RDD. Because of this, the switch elements SW1 to SWn switch in such a way as to be connected to the sense amplifiers SA and SA_RDD of the memory units MU2 to MUn and the redundant unit RDD respectively. Consequently, the switching circuit SWC selectively outputs output signals from the sense amplifiers SA of the memory units MU2 to MUn and the sense amplifier SA_RDD of the redundant unit RDD. No signal from the sense amplifier SA1 of the memory unit MU1 is output.

The switch element SWn outputs data from the bit line VBLf1_RDD of the redundant unit RDD. A memory cell MCf1_RDD of the bit line VBLf1_RDD stores data instead of the defective cell MCf1. Consequently, the switch element SWn can output data that should be stored in the defective cell MCf1.

FIG. 6 shows a state of the switching circuit SWC when the bit line VBLf2 that has the defective cell MCf2 is a read target. In this case, the memory unit MU2 that has the bit line VBLf2 is not selected, because of which the switch elements SW2 to SWn switch to connect to the sense amplifiers SA of the memory units MU3 to MUn and the redundant unit RDD respectively. That is, the switching circuit SWC switches all the switch elements SW2 to SWn from the switch element SW2 corresponding to the memory unit MU2 that has the bit line VBLf2 and the sense amplifier SA2 to the switch element SWn corresponding to the sense amplifier SAn neighboring the sense amplifier SA_RDD. Meanwhile, the switch element SW1 remains connected to the sense amplifier SA of the memory unit MU1, in the same way as the switch element SW1 of FIG. 4. Consequently, the switching circuit SWC selectively outputs output signals from the sense amplifiers SA of the memory units MU1 and MU3 to MUn, and the sense amplifier SA_RDD of the redundant unit RDD.

The switch element SWn outputs data from the bit line VBLf2_RDD of the redundant unit RDD. A memory cell MCf2_RDD of the bit line VBLf2_RDD stores data instead of the defective cell MCf2. Consequently, the switch element SWn can output data that should be stored in the defective cell MCf2.

In the same way, when there is a memory unit MUj (j is any integer between 1 and n) including the bit line VBL that has a defective cell among bit lines VBL that are read targets in each memory unit MU1 to MUn, the bit line VBL of the memory unit MUj is not selected, because of which the switch elements SWj to SWn switch to connect to the sense amplifiers SA of the memory units MUj+1 to MUn and the redundant unit RDD respectively. That is, the switching circuit SWC switches all the switch elements SWj to SWn from the switch element SWj corresponding to the memory unit MUj that has a bit line VBLj and a sense amplifier SAj to the switch element SWn corresponding to the sense amplifier SAn neighboring the sense amplifier SA_RDD. Meanwhile, the switch elements SW1 to SWj−1 remain connected to the sense amplifiers SA1 to SAj−1 of the memory units MU1 to MUj−1, in the same way as the switch element SW1 of FIG. 4. Because of this, the switching circuit SWC selectively outputs output signals from the sense amplifiers SA of the memory units MU1 to MUj−1 and MUJ+1 to MUn, and the sense amplifier SA_RDD of the redundant unit RDD. No signal from the sense amplifier SAj of the memory unit MUj is output.

The switch element SWn outputs data from the redundant unit RDD. A selected memory cell of the redundant unit RDD stores data instead of a defective cell. Consequently, the switch element SWn can output data that should be stored in the defective cell.

Figure 7:
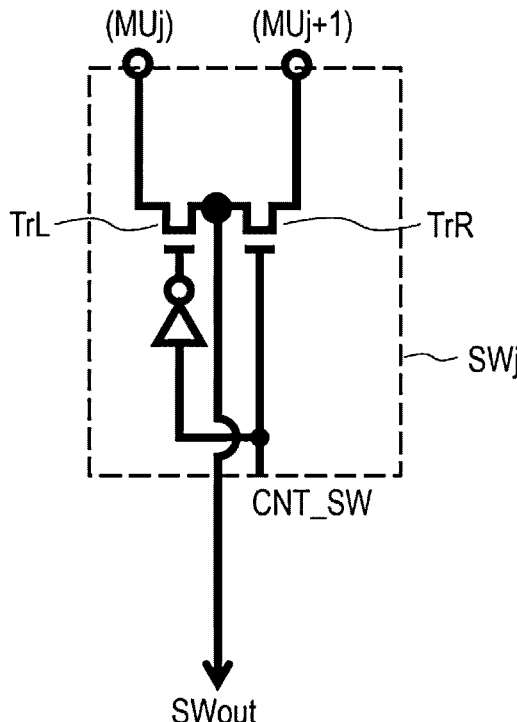
FIG. 7 is a circuit diagram showing an example of a configuration of a switch element.

FIG. 7 is a circuit diagram showing an example of a configuration of the switch element SWj. The switch element SWj includes transistors TrL and TrR. One end of the transistor TrL is connected to an output of the sense amplifier SA of the memory unit MUj, and another end is connected to the transistor TrR. A gate of the transistor TrL is connected to the switch control circuit SSC via an inverter INV, and receives an inversion of the control signal CNT_SW. One end of the transistor TrR is connected to an output of the sense amplifier SA of the memory unit MUj+1, and another end is connected to the transistor TrL. A gate of the transistor TrR is connected to the switch control circuit SSC, and receives the control signal CNT_SW. Consequently, the transistor TrR is in a non-conductive state (i.e., an off-state) when the transistor TrL is in a conductive state (i.e., an on-state), and is in an on-state when the transistor TrL is in an off-state. That is, the transistors TrR and TrL carry out on/off operations in a mutually complementary way.

The transistors TrL and TrR are connected in series between the outputs of the two neighboring sense amplifiers SAj and SAj+1. Alternatively, the transistors TrL and TrR are connected in series between the outputs of the two neighboring sense amplifiers SAn and SA_RDD. A node between the serially connected transistor TrL and transistor TrR forms an output SWout. Consequently, the switch element SWj outputs data from the memory unit MUj when the transistor TrL is in the on-state. When the transistor TrR is in the on-state, the switch element SWj outputs data from the memory unit MUj+1 or the redundant unit RDD. In this way, the switch element SWj outputs data from either the sense amplifier SAj of the memory unit MUj or the sense amplifier SAj+1 of the memory unit MUj+1. It should be noted that the switch element SWn between the memory unit MUn and the redundant unit RDD is connected to the sense amplifier SAn of the memory unit MUn and the sense amplifier SA_RDD of the redundant unit RDD, and outputs data from either the sense amplifier SAn or the sense amplifier SA_RDD.

The transistors TrL and TrR may be n-type metal-oxide-semiconductor field-effect transistors (MOSFETs). By adopting MOSFETs of the same conductivity as the transistors TrL and TrR, design is simplified. The transistor TrL may also be configured with a p-type MOSFET. By so doing, the switch element SW may be configured with a complementary metal-oxide-semiconductor (CMOS). In this case, the inverter INV connected to the gate of the transistor TrL is omitted.

Figure 8:
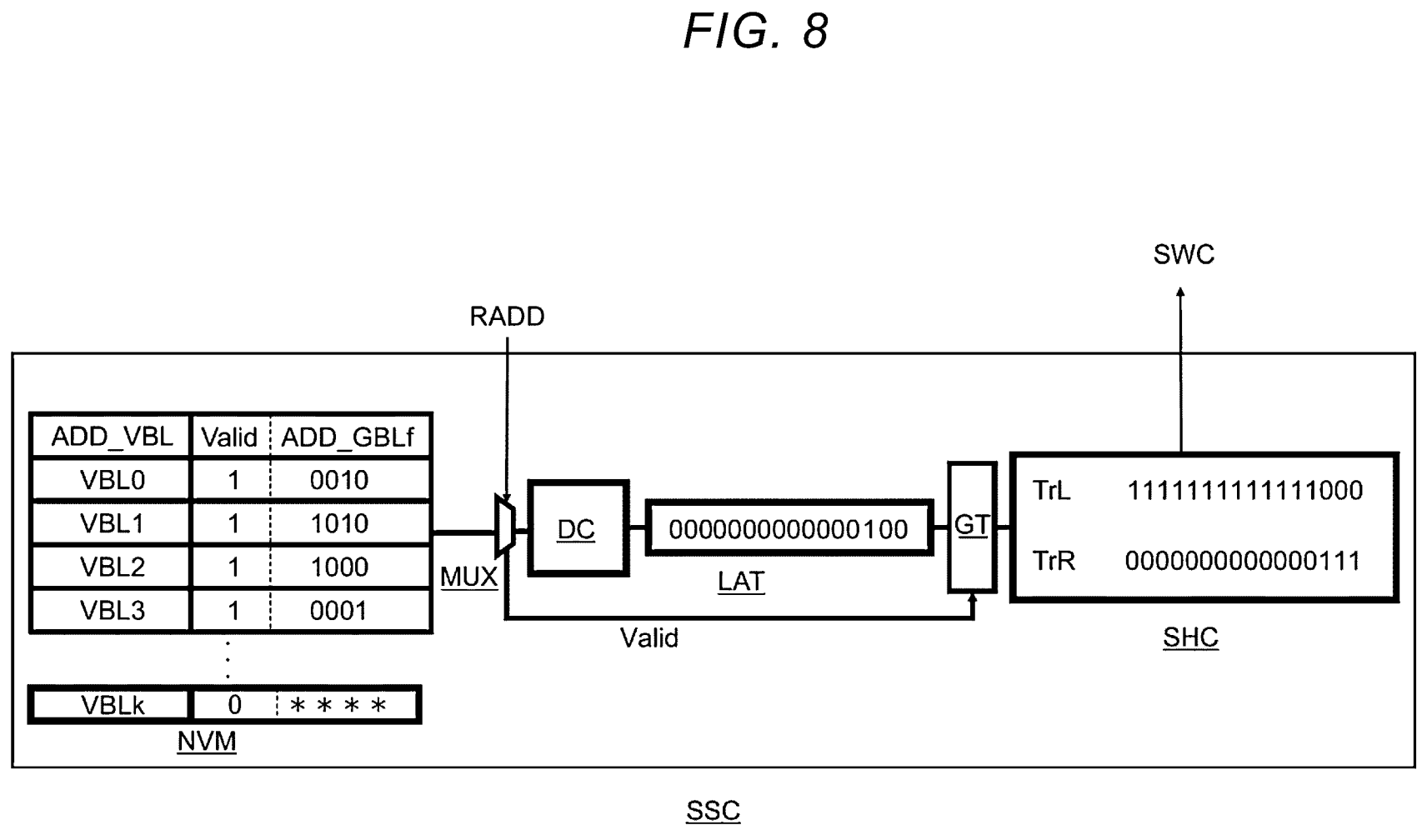

FIG. 8 is a conceptual drawing showing an example of a configuration and an example of an operation of the switch control circuit SSC. The switch control circuit SSC includes a memory NVM, a multiplexer MUX, a decoder DC, a latch circuit LAT, a gate circuit GT, and a shift circuit SHC. A CPU and software, or a logic circuit such as a PLC, may be used as the switch control circuit SSC.

The memory NVM stores address information relating to a defective cell. Defective cell address information is, for example, an address ADD_GBLf of the global bit line GBL connected to the bit line VBL that has the defective cell. One item of defective cell address information ADD_GBLf can be stored with respect to each address ADD_VBL (VBL0, VBL1, VBL2, and so on) of the bit line VBL. The address ADD_VBL of the bit line VBL that is a target of a read operation is specified in accordance with the row address RADD. Consequently, the bit line VLB arrayed in the direction in which the word line WL extends (i.e., the X direction in FIG. 3) are specified by the address ADD_VBL. For example, when the address ADD_VBL of the bit line VBL that is a read target is VBL0, one of the bit lines VBL at the head of each memory unit MU and one of the bit lines VBL_RDD0 at the head of the redundant unit RDD in FIG. 3 are selected. Data from the bit lines VBL0 selected in each of the memory units MU and/or the bit line VBL_RDD0 are output at one time from the global bit line GBL of each corresponding column. The defective cell address information ADD_GBLf is the address of the global bit line GBL connected to the bit line VBL that has the defective cell among the selected bit lines VBL0 specified by the address ADD_VBL of the bit line VBL.

When the bit lines VBLk (k is an integer) connected to the same word line WL (that is, specified by the same row address RADD) have no defective cell, any address information ADD_GBLf may be used.

Meanwhile, the memory NVM stores validity information "Valid," which indicates whether there is a defective cell, for each address ADD_VBL. The validity information "Valid" is "1" for the address ADD_VBL that has a defective cell, and the validity information "Valid" is "0" for the address ADD_VBL that has no defective cell. For example, when the address ADD_VBL is VBLk, there is no defective cell, so the validity information "Valid" is "0". In this case, as heretofore mentioned, any address information ADD_GBLf corresponding to the bit line VBLk may be used.

The memory NVM is a non-volatile memory such as FUSE or a flash memory. The same memory NVM may be provided for the memory units MU and the redundant unit RDD.

The multiplexer MUX receives the row address RADD of the selected word line WL that is a read target from the controller CNT. Based on the row address RADD of the selected word line WL, the multiplexer MUX selectively transmits the address ADD_GBLf of the global bit line GBL corresponding to the address ADD_VBL of the bit line VBL that is a read target to the decoder DC. Also, the multiplexer MUX selectively transmits the validity information "Valid" corresponding to the address ADD_VBL of the bit line VBL that is a read target to the gate circuit GT.

For the sake of convenience, it is assumed that the switching circuit SWC is configured with sixteen switch elements SW. In this case, the address ADD_GBLf can be expressed as 4-bit data, as shown in FIG. 8. The transmitted address ADD_GBLf (i.e., 4-bit data) indicates a position of the global bit line GBL connected to the bit line VBL0 that includes a defective cell among the bit lines VBL0 specified by the row address RADD. For example, when the address of the selected bit line VBL is VBL0, the multiplexer MUX transmits an address ADD_GBLf "0010" to the decoder DC. The address ADD_GBLf "0010" indicates that, for example, there is a defective cell in the bit line VBL0 connected to the global bit line GBL in the third column from the right among the global bit lines GBL.

The decoder DC decodes the address ADD_GBLf from the multiplexer MUX, and transmits the decoded address ADD_GBLf to the latch circuit LAT. For example, the decoder DC converts the 4-bit data "0010" of the address ADD_GBLf into 16-bit data. The 16-bit data are converted data indicating the position of the switch element SWj corresponding to the global bit line GBL that includes a defective cell.

The latch circuit LAT latches the converted data decoded by the decoder DC. For example, the latch circuit LAT latches the 16-bit data based on the 4-bit data "0010" of the address ADD_GBLf as converted data. The 16-bit data of FIG. 8 are such that the bit third from the right is inverted to "1", and other bits are "0". Because of this, it is understood that there is a defective cell in the bit line VBL0 connected to the global bit line GBL in the third column from the right among the global bit lines GBL. The latch circuit LAT is a volatile memory such as an SRAM or a flip-flop.

The gate circuit GT, based on the validity information "Valid", transmits the converted data (i.e., 16-bit data) latched by the latch circuit LAT as valid to the shift circuit SHC, or invalidates the converted data latched by the latch circuit LAT and does not transmit the converted data to the shift circuit SHC. For example, when the validity information "Valid" is "1", the gate circuit GT transmits the converted data latched by the latch circuit LAT as valid to the shift circuit SHC. Meanwhile, when the validity information "Valid" is "0", the gate circuit GT invalidates the converted data latched by the latch circuit LAT and does not transmit the converted data to the shift circuit SHC. A case in which the validity information "Valid" is "O" will be described hereafter.

Figure 9:
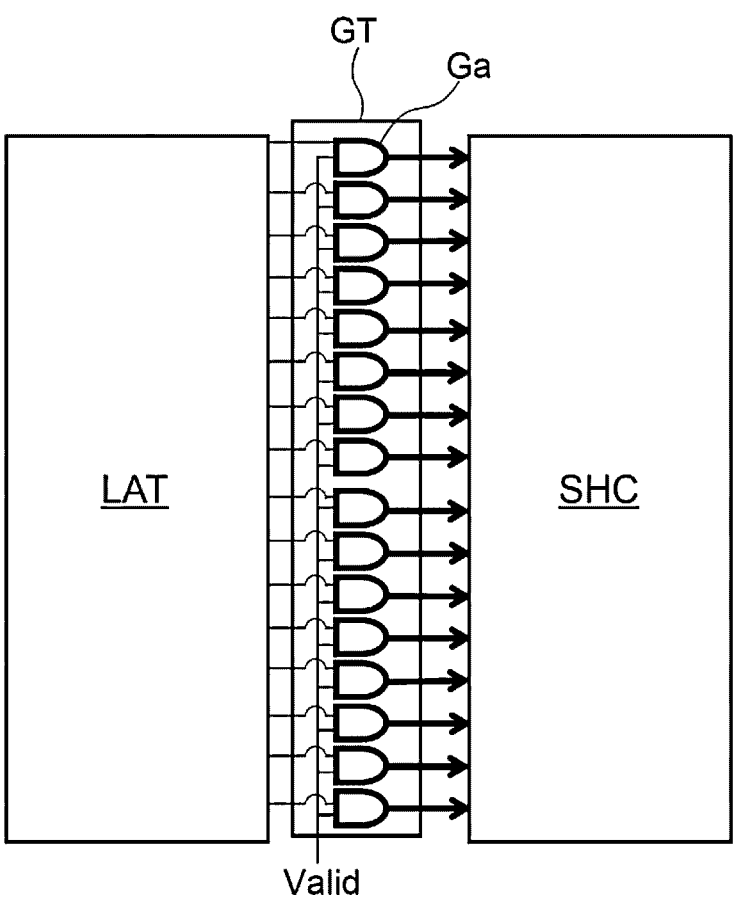
FIG. 9 is a block diagram showing an example of a gate circuit.

FIG. 9 is a block diagram showing an example of a gate circuit GT. The gate circuit GT includes an AND circuit Ga corresponding to each bit of converted data. For example, when converted data are 16-bit data, the gate circuit GT includes sixteen AND circuits Ga. One input terminal of the AND circuit Ga inputs a corresponding bit of converted data. Another input terminal of the AND circuit Ga inputs shared validity information "Valid". This means that when the validity information "Valid" is "1", the AND circuit Ga outputs the converted data (i.e., 16-bit data) as valid). Meanwhile, when the validity information "Valid" is "0", the AND circuit Ga invalidates the converted data, and does not output the converted data. A configuration of the gate circuit GT is not limited to this.

The shift circuit SHC converts converted data transmitted from the gate circuit GT into the control signal CNT_SW for the transistors TrL and TrR of the switch element SW. For example, only the third from the right of the 16 bits of converted data in FIG. 8 is inverted to "1". In this case, arranging that the control signal CNT_SW for the transistor TrR is of the same 16-bit data as the converted data, the shift circuit SHC generates the control signal CNT_SW such that the bits from the right end bit to the bit third from the right end are "1", and the other bits are "0". In this case, a signal that is an inversion of the control signal CNT_SW input into the gate of the transistor TrR in the switch element SWj is input into the gate of the transistor TrL. That is, the control signal input into the gate of the transistor TrL is such that the bits from the right end bit to the bit third from the right end are "0", and the other bits are "1". The shift circuit SHC transmits the control signal CNT_SW to the switching circuit SWC.

Figure 10:
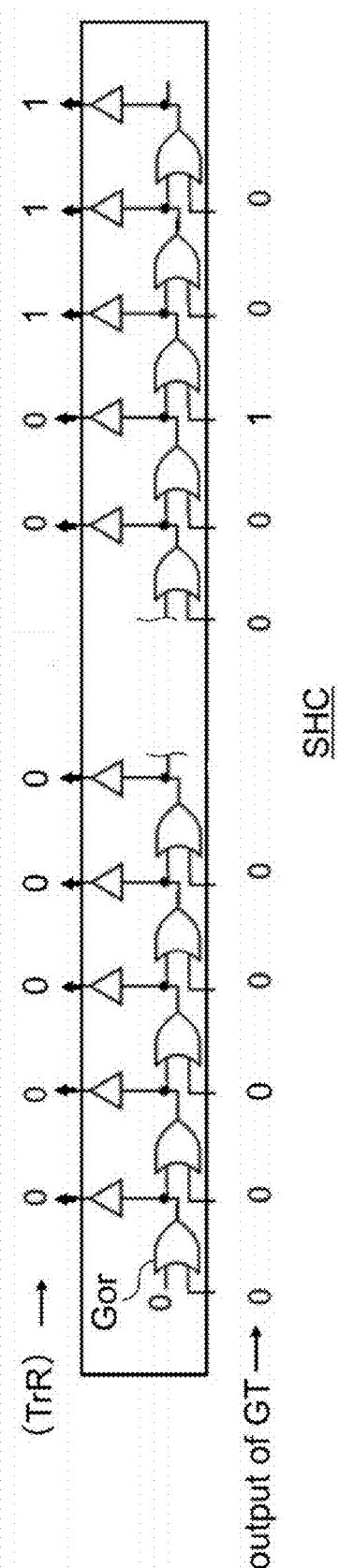
FIG. 10 is a block diagram showing an example of a shift circuit.

FIG. 10 is a block diagram showing an example of a shift circuit SHC. The shift circuit SHC includes an OR circuit Gor corresponding to each bit of converted data. For example, when converted data are 16-bit data, the shift circuit SHC includes sixteen OR circuits Gor. One input terminal of the OR circuit Gor inputs a corresponding bit of converted data. Another input terminal of the OR circuit Gor inputs 0 or the output of the neighboring OR circuit Gor in the immediately preceding column. Because of this, all OR circuits Gor from the OR circuit Gor in the first column that inputs 0 from the other input terminal to the OR circuit Gor that inputs the converted data "0" output "0". All OR circuits Gor in columns from the OR circuit Gor that inputs the converted data "1" onward output "1". Based on this, the shift circuit SHC converts the converted data from the gate circuit GT into the control signal CNT_SW for the transistor TrR. It is sufficient that the control signal CNT_SW for the transistor TrL is such that the logic of the control signal CNT_SW for the transistor TrR is inverted using an inverter or the like. In FIG. 10, the output signal from the OR circuit Gor is output to the switching circuit SWC side via a buffer, but the buffer can be omitted.

When all the bits of converted data are "0" (that is, when there is no defective cell), the control signal CNT_SW for the transistor TrR is all "0", and the signal input into the gate of the transistor TrL is all "1".

Also, for example, when the control signal CNT_SW for the transistor TrR is such that the bits from the right end bit to the bit third from the right end are "1", and the other bits are "0", the switching circuit SWC switches the transistors TrR from the right end transistor TrR to the transistor TrR third from the right end to the on-state, and switches the other transistors TrR to the off-state. Meanwhile, the control signal input into the gate of the transistor TrL is such that the bits from the right end bit to the bit third from the right end are "0", and the other bits are "1", because of which the switching circuit SWC switches the transistors TrL from the right end transistor TrL to the transistor TrL third from the right end to the off-state, and switches the other transistors TrL to the on-state. Because of this, the switching circuit SWC does not output data from the sense amplifier SA in the column third from the right. That is, the switching circuit SWC does not output data from the bit line VBL0 that has a defective cell or the global bit line GBL, but instead outputs data from the sense amplifier SA_RDD of the redundant unit RDD.

In the same way, when the address ADD_VBL of the selected bit line VBL specified by the row address RADD is VBL1, the multiplexer MUX transmits the address ADD_GBLf "1010" to the decoder DC. The address ADD_GBLf "1010" indicates that, for example, there is a defective cell in the bit line VBL1 connected to the global bit line GBL in the eleventh column from the right among the global bit lines GBL.

On the decoder DC decoding the address ADD_GBLf "1010", the 16-bit data become "0000010000000000".

When the address ADD_VBL is VBL1, the validity information "Valid" is "1", because of which the gate circuit GT transmits the converted data latched by the latch circuit LAT as valid to the shift circuit SHC.

On the shift circuit SHC changing the 16-bit data, the control signal CNT_SW for the transistor TrR becomes "0000011111111111". The control signal input into the gate of the transistor TrL is "1111100000000000".

Because of this, the switching circuit SWC switches the transistors TrR from the right end transistor TrR to the transistor TrR eleventh from the right end to the on-state, and switches the other transistors TrR to the off-state. Meanwhile, the switching circuit SWC switches the transistors TrL from the right end transistor TrL to the transistor TrL eleventh from the right end to the off-state, and switches the other transistors TrL to the on-state. Because of this, the switching circuit SWC does not output data from the sense amplifier SA in the column eleventh from the right. That is, the switching circuit SWC does not output data from the bit line VBL1 that has a defective cell or the global bit line GBL, but instead outputs data from the sense amplifier SA_RDD of the redundant unit RDD.

In the same way, when the address of the selected bit line VBL indicated by the row address RADD is VBL2, the switch control circuit SSC transmits an address ADD_GBLf "1000" to the multiplexer MUX. The address ADD_GBLf "1000" indicates that, for example, there is a defective cell in the bit line VBL2 connected to the global bit line GBL in the ninth column from the right among the global bit lines GBL.

On the latch circuit LAT decoding the address ADD_GBLf "1000", the 16-bit data become "0000000100000000".

When the address ADD_VBL is VBL2, the validity information "Valid" is "1", because of which the gate circuit GT transmits the converted data latched by the latch circuit LAT as valid to the shift circuit SHC.

On the shift circuit SHC changing the 16-bit data, the control signal CNT_SW for the transistor TrR becomes "0000000111111111". The control signal input into the gate of the transistor TrL is "1111111000000000".

Because of this, the switching circuit SWC switches the transistors TrR from the right end transistor TrR to the transistor TrR ninth from the right end to the on-state, and switches the other transistors TrR to the off-state. Meanwhile, the switching circuit SWC switches the transistors TrL from the right end transistor TrL to the transistor TrL ninth from the right end to the off-state, and switches the other transistors TrL to the on-state. Because of this, the switching circuit SWC does not output data from the sense amplifier SA in the column ninth from the right. That is, the switching circuit SWC does not output data from the bit line VBL2 that has a defective cell or the global bit line GBL, but instead outputs data from the sense amplifier SA_RDD of the redundant unit RDD.

When the address ADD_VBL of the selected bit line VBL indicated by the row address RADD is VBLk, the switch control circuit SSC transmits any address ADD_GBLf "**" to the multiplexer MUX. The address ADD_GBLf "**" is decoded by the decoder DC via the multiplexer MUX, and latched by the latch circuit LAT. As the validity information "Valid" is "0", however, the gate circuit GT arranges that all bits of the converted data are "0", regardless of the address ADD_GBLf. In this case, the shift circuit SHC arranges that all bits of the control signal CNT_SW for the transistor TrR are "0". In this case, the control signal input into the gate of the transistor TrL in the switch element SWj is an inversion of the control signal CNT_SW for the transistor TrR. That is, all bits of the control signal CNT_SW for the transistor TrL are "1".

Because of this, the switching circuit SWC switches the transistors TrL in all columns to the on-state. Because of this, the switching circuit SWC outputs data from the sense amplifiers SA of all columns, and does not output data from the sense amplifier SA_RDD of the redundant unit RDD.

A configuration of the shift circuit SHC is not limited to this.

In this way, the semiconductor memory device 1 according to the present embodiment is such that when a read operation by the memory cell array MCA having a hierarchical bit line structure is carried out, the global bit line GBL connected to the local bit line VBL that has a defective cell is identified based on the row address RADD that specifies the local bit line VBL. The switching circuit SWC selects the redundant unit RDD instead of the global bit line GBL connected to the local bit line VBL that has a defective cell. This means that by switching the switching circuit SWC for each local bit line VBL specified by the row address RADD when a read operation is carried out, the global bit line GBL_RDD of the redundant unit RDD can be selected instead of the global bit line GBL connected to the local bit line VBL that has a defective cell. This means that even when multiple defective cells exist across multiple local bit lines VBL, the defective cells can be rescued by the redundant units RDD, provided that the row addresses RADD differ.

When the switching circuit SWC is fixed using FUSE or the like, the redundant unit RDD can rescue a defective cell in one global bit line GBL, but cannot rescue a defective cell in another global bit line GBL. Also, the normal local bit line VBL that shares the global bit line GBL with the local bit line VBL that has a defective cell is not used, which is wasteful.

In response to this, the switching circuit SWC according to the present embodiment switches the switch element SW in accordance with the local bit line VBL specified by the row address RADD. This means that the present embodiment is such that even when multiple defective cells exist across multiple global bit lines GBL or multiple local bit lines VBL, the defective cells can be rescued by the redundant units RDD, provided that the row addresses RADD differ. Also, the normal local bit line VBL that shares the global bit line GBL with the local bit line VBL that has a defective cell can be used without waste.

It should be noted that when there are multiple defective cells in multiple bit lines VBL0 that have the same row address and share a word line, the defective cells cannot be rescued by the redundant units RDD. In this case, it is sufficient to add a redundant array, a redundant word line, and a redundant bit line VBL (not shown in the drawings) in the Y direction in FIG. 3, FIG. 12, or FIG. 13, and to specify a row address selecting the redundant word line instead of a row address specifying the bit line VBL0. This means that even when there are multiple defective cells in multiple bit lines VBL0 that have the same row address, those defective cells can be rescued.

The gate circuit GT may be provided between the decoder DC and the latch circuit LAT. When the gate circuit GT is between the decoder DC and the latch circuit LAT, the gate circuit GT transfers data from the decoder DC to the latch circuit LAT unchanged when the validity information "Valid" is "1". The gate circuit GT does not transfer data from the decoder DC to the latch circuit LAT when the validity information "Valid" is "0". Even with this kind of configuration, no advantage of the present embodiment is lost.

Second Embodiment

Figure 11:
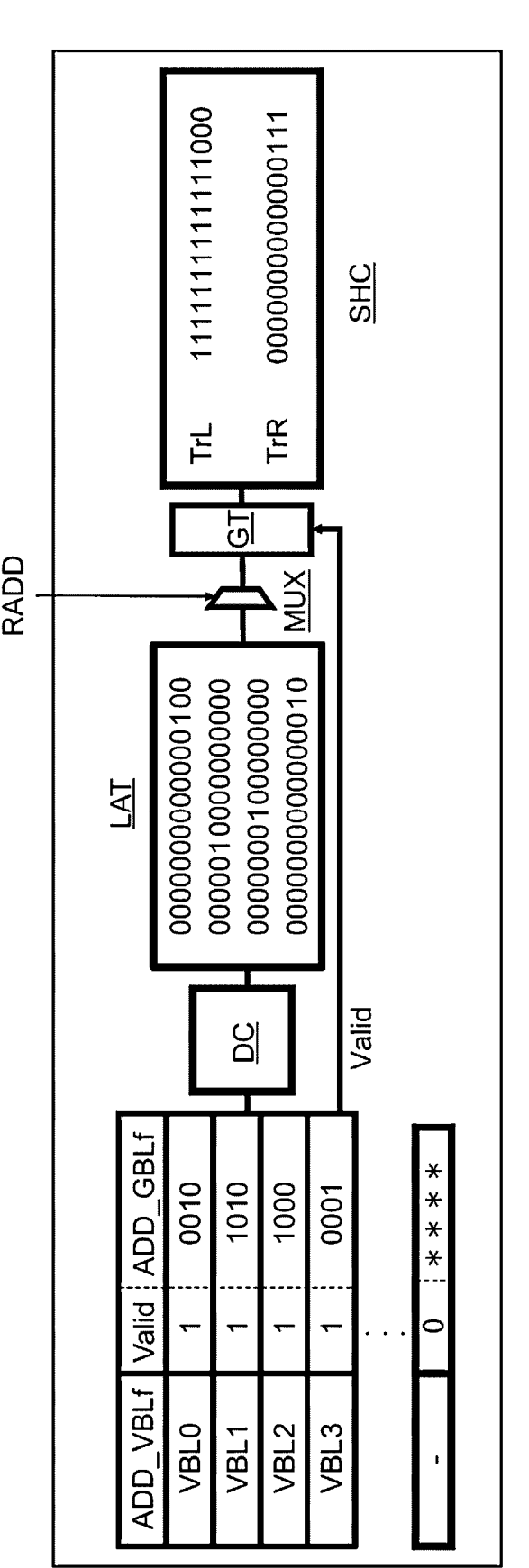
FIG. 11 is a conceptual drawing showing an example of a configuration and an example of an operation of the switch control circuit according to a second embodiment.

FIG. 11 is a conceptual drawing showing an example of a configuration and an example of an operation of the switch control circuit SSC according to a second embodiment. In the second embodiment, when a read operation is carried out, the switch control circuit SSC decodes all the addresses ADD_GBLf of the global bit lines GBL and all the addresses ADD_VBL of the bit lines VBL that have a defective cell before the read operation, and holds the addresses in the latch circuit LAT. Also, the switch control circuit SSC holds the validity information "Valid" in an unshown separate latch circuit.

The multiplexer MUX transmits the address ADD_GBLf of the global bit line GBL connected to the bit line VBL that is a read target from the latch circuit LAT to the gate circuit GT based on the row address RADD. The gate circuit GT transmits converted data latched by the latch circuit LAT as valid to the shift circuit SHC based on the validity information "Valid" of the corresponding row address RADD, or alternatively, invalidates the converted data latched by the latch circuit LAT, and does not transmit the converted data to the shift circuit SHC.

In this way, the multiplexer MUX may selectively output the address ADD_GBLf of the global bit line GBL connected to the local bit line VBL that has a defective cell from the latch circuit LAT.

In this case, the multiplexer MUX is provided between the latch circuit LAT and the gate circuit GT. The gate circuit GT is provided between the multiplexer MUX and the shift circuit SHC.

Other configurations and operations of the second embodiment may be the same as the corresponding configurations and operations of the first embodiment. Because of this, the same advantages as with the first embodiment can be obtained with the second embodiment.

Bit Line VBL Disposition

Figure 12:
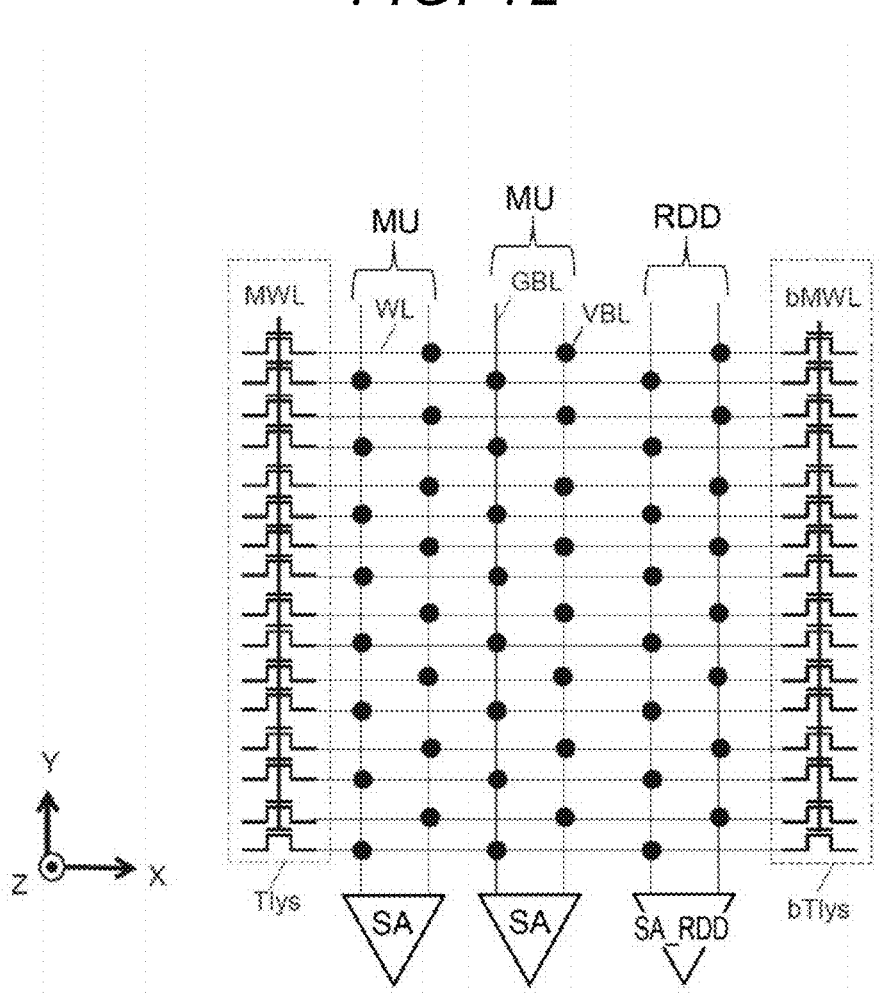
FIG. 12 is a schematic plan view showing an example of a bit line disposition.

FIG. 12 is a schematic plan view showing an example of a disposition of the bit line VBL. FIG. 12 shows a plan view seen from the Z direction. In the example, the bit line VBL is disposed intermittently in positions in which the word line WL and the global bit line GBL intersect. For example, the bit line VBL is disposed in every other one of the aforementioned intersection positions arrayed in the X direction along the word line WL, and is disposed in every other one of the aforementioned intersection positions arrayed in the Y direction along the global bit line GBL.

In this case, the two input terminals of the sense amplifier SA are connected one to each of a pair of neighboring global bit lines GBL electrically connected to one memory cell array. The bit line VBL connected to one word line WL selected by a row address is connected to only one of a pair of neighboring global bit lines GBL. The other of the pair of global bit lines GBL, not being connected to the bit line VBL, transmits a reference signal. The sense amplifier SA_RDD also has the same connection configuration.

In this way, the sense amplifiers SA and SA_RDD may be connected to a pair of the global bit lines GBL electrically connected to one memory cell array. This kind of bit line configuration is also called a folded bit line configuration.

Figure 13:
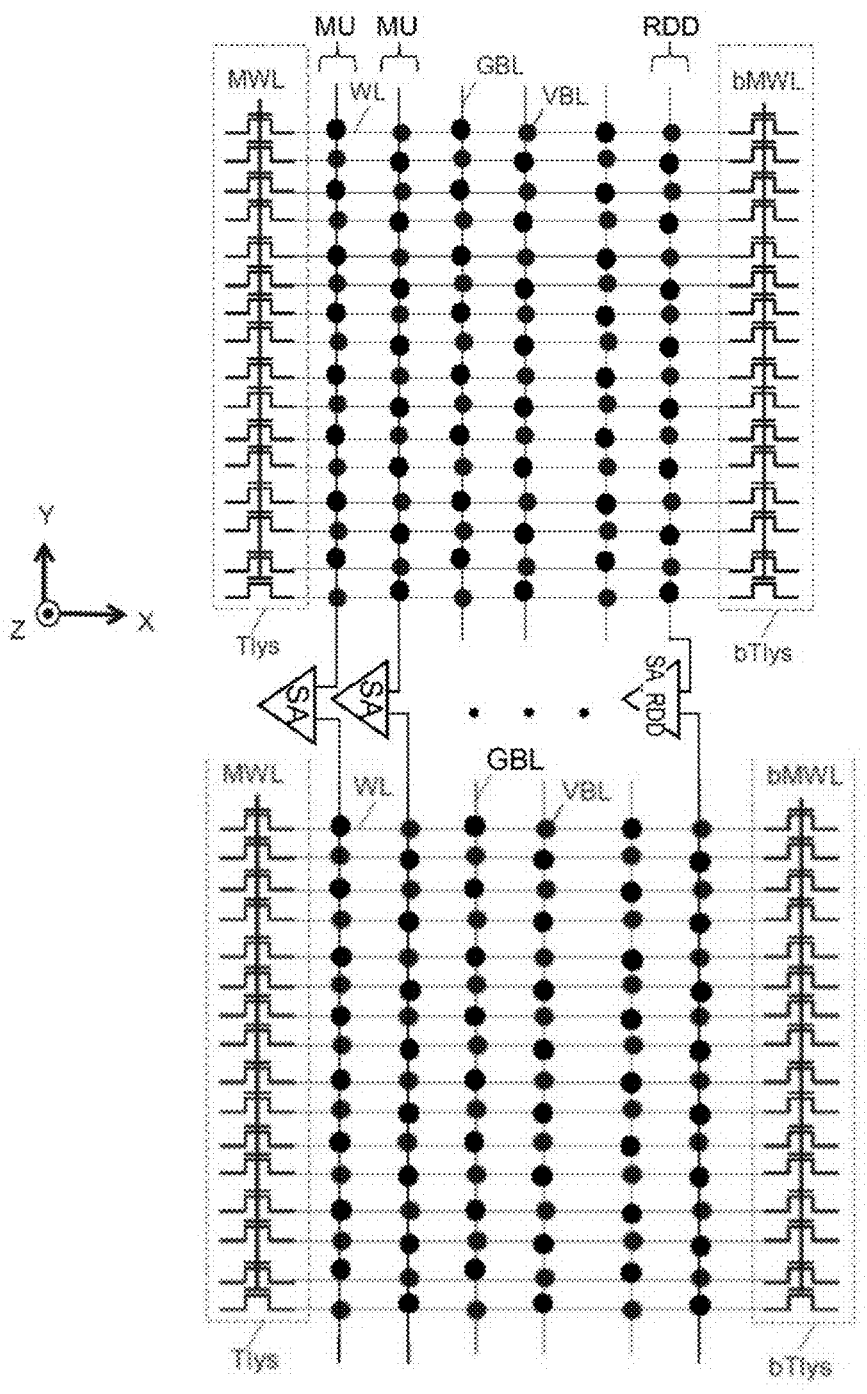
FIG. 13 is a schematic plan view showing another example of a bit line disposition.

FIG. 13 is a schematic plan view showing another example of a disposition of the bit line VBL. FIG. 13 shows a plan view seen from the Z direction. In the example, the bit line VBL is disposed in each position in which the word line WL and the global bit line GBL intersect. For example, the bit line VBL is disposed in each of the aforementioned intersection positions arrayed in the X direction along the word line WL, and is disposed in each of the aforementioned intersection positions arrayed in the Y direction along the global bit line GBL.

In this case, the two input terminals of the sense amplifier SA are connected to a pair of the global bit line GBL electrically connected one each to two memory cell arrays, one on either side. The bit line VBL connected to one word line WL selected by a row address is connected to one of a pair of global bit lines GBL. The other of the pair of global bit lines GBL, not being connected to the bit line VBL, transmits a reference signal. The sense amplifier SA_RDD also has the same connection configuration.

In this way, the sense amplifiers SA and SA_RDD may be connected to a pair of the global bit line GBL electrically connected to two memory cell arrays. This kind of bit line configuration is also called an open bit line configuration.

The bit line configuration of the heretofore described embodiments may be either a folded bit line configuration or an open bit line configuration.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor memory device, comprising:
   a cell array including a plurality of memory cells;

US 12,626,777 B2

15 a plurality of first wirings extending along a first direction and connected to the memory cells;

a plurality of second wirings extending along a second direction and connected to the memory cells, the second direction intersecting the first direction;

a plurality of third wirings extending along a third direction and each connected to one or more of the second wirings, the third direction intersecting the first and second directions;

a plurality of sense circuits each connected to one or more of the third wirings;

a switching circuit connected to the sense circuits and through which signals from the sense circuits are selectively output; and a control circuit configured to:

store first addresses indicating second and third wirings that are connected to defective memory cells, and when a first memory cell is selected for a read operation, determine second addresses indicating second and third wirings that are connected to the first memory cell, and based on the first and second addresses, control the switching circuit so as not to output signals from one or more first sense circuits that are connected to the defective memory cells via the second and third wirings.

2. The semiconductor memory device according to claim 1, wherein the switching circuit includes a plurality of switching elements, each of which is switchable to connect to one of two sense circuits that are adjacent to each other, the switching elements including a first switching element that is switchable between one of the first sense circuits and another sense circuit, and the control circuit outputs a control signal to control the switching circuit, the control signal causing the first switching element to switch from said one of the first sense circuits to said another sense circuit.

3. The semiconductor memory device according to claim 2, wherein the sense circuits are arranged from one side to another side along the first direction, and each of the switching elements is connected to one of the two sense circuits closer to said one side, before the control signal is output, and the control signal causes one or more of the switching elements closer to said another side than the first switching element to switch to the other of the two sense circuits.

4. The semiconductor memory device according to claim 3, wherein the control signal indicates a sequence of bits each corresponding to one of the switching elements, and two or more of the bits corresponding to the first switching element and said one or more of the switching elements are inverted with respect to the other bits.

5. The semiconductor memory device according to claim 3, wherein the control circuit includes:

a memory that stores the first addresses indicating the second and third wirings that are connected to the defective memory cells, a multiplexer connected to the memory and by which one of the first addresses indicating one of the third wirings that is connected to the defective memory cell via the second wiring is selectively output using an address indicating one of the first wirings connected to the first memory cell, a decoder connected to the multiplexer and by which said one of the first addresses that is output from the multiplexer is converted into first data such that the first data indicates one of the switching elements connected to one of the sense circuits corresponding to said one of the first addresses, a latch circuit connected to the decoder for latching the first data, and a shift circuit connected to the latch circuit and by which the control signal is generated, the control signal causing said one of the switching elements indicated by the first data and other switching elements closer to said another side than said one of the switching elements to switch.

6. The semiconductor memory device according to claim 5, further comprising:

a gate circuit between the latch circuit and the shift circuit, wherein the memory stores validity information indicating an existence of a defective memory cell for each of the second wirings, and the gate circuit outputs the first data latched by the latch circuit to the shift circuit based on the validity information.

7. The semiconductor memory device according to claim 3, wherein the control circuit includes:

a memory that stores the first addresses indicating the second and third wirings that are connected to the defective memory cells, a decoder connected to the memory and by which one or more of the first addresses indicating the third wirings that are connected to the defective memory cells are converted into one or more pieces of second data such that the pieces of second data respectively indicate the switching elements connected to the sense circuits corresponding to said one or more of the first addresses, a latch circuit connected to the decoder for latching the pieces of second data, a multiplexer connected to the latch circuit and by which one of the pieces of second data corresponding to one of the third wirings connected to the defective memory cell via the second wiring is selectively output using an address indicating one of the first wirings connected to the first memory cell, and a shift circuit connected to the multiplexer and by which the control signal is generated, the control signal causing one of the switching elements indicated by said one of the pieces of second data and other switching elements closer to said another side than said one of the switching elements to switch.

8. The semiconductor memory device according to claim 7, further comprising:

a gate circuit between the multiplexer and the shift circuit, wherein the memory stores validity information indicating an existence of a defective memory cell for each of the second wirings, and the gate circuit outputs said one of the pieces of second data to the shift circuit based on the validity information.

9. The semiconductor memory device according to claim 2, wherein each of the switching elements is connected in series between two sense circuits that are adjacent to each other.

10. The semiconductor memory device according to claim 9, wherein each of the switching elements includes two transistors that are respectively connected to the two sense circuits and operate in a way complementary to each other such that a signal from either one of the two sense circuits is output from a node between the two transistors.

11. The semiconductor memory device according to claim 1, wherein the cell array is a three-dimensional memory cell array.

12. The semiconductor memory device according to claim 1, wherein each of the memory cells includes:

a first transistor including a source, a drain, and a gate that is connected to one of the first wirings, one of the source and the drain being connected to one of the second wirings, and a first capacitor connected to the other of the source and the drain of the first transistor.

13. The semiconductor memory device according to claim 1, wherein each of the memory cells is disposed at an intersection of one of the first wirings and one of the second wirings, and one end of each of the second wirings is connected to one of the third wirings.

14. The semiconductor memory device according to claim 1, wherein in response to the read operation, a data signal is conveyed by one of the third wirings, and a reference signal to be used to detect the data signal is conveyed by another of the third wirings.

15. The semiconductor memory device according to claim 1, wherein each of the sense circuits is connected to one pair of the third wirings that are adjacent to each other.

16. The semiconductor memory device according to claim 1, wherein each of the sense circuits is connected to one pair of the third wirings, and is between the one pair of the third wirings.

17. The semiconductor memory device according to claim 1, further comprising:

a plurality of fourth wirings extending along the third direction and arranged along the second direction, each of the fourth wirings being connected to one or more of the first wirings, wherein the cell array includes a plurality of memory cell layers corresponding to the fourth wirings.

18. The semiconductor memory device according to claim 17, further comprising:

a plurality of second transistors disposed at ends of the first wirings, wherein the fourth wirings are connected to gates of the second transistors.

19. The semiconductor memory device according to claim 1, further comprising:

a plurality of third transistors disposed at ends of the second wirings, wherein the third wirings are connected to the second wirings via the third transistors.

20. The semiconductor memory device according to claim 1, further comprising:

a controller configured to output to the control circuit an address indicating one of the first wirings connected to the first memory cell, wherein the control circuit determines the second addresses using the address that is output by the controller.

21. The semiconductor memory device according to claim 1, wherein the sense circuits include a redundant sense circuit that is connected to one or more of the memory cells via the second and third wirings, a signal from the redundant sense circuit being not output from the switching circuit when there is no defective memory cell in the cell array.

* * * * *